US009870835B2

(12) United States Patent
Chen

(10) Patent No.: US 9,870,835 B2
(45) Date of Patent: Jan. 16, 2018

(54) MEMORY REPAIRING METHOD AND MEMORY DEVICE APPLYING THE SAME

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 134 days.

(21) Appl. No.: 14/637,476

(22) Filed: Mar. 4, 2015

(65) Prior Publication Data

US 2016/0260501 A1    Sep. 8, 2016

(51) Int. Cl.
  *G11C 29/00* (2006.01)
  *G11C 29/44* (2006.01)
  *G06F 11/10* (2006.01)
  *G11C 29/52* (2006.01)
  *G11C 29/56* (2006.01)

(52) U.S. Cl.
  CPC ...... *G11C 29/4401* (2013.01); *G06F 11/1068* (2013.01); *G11C 29/52* (2013.01); *G11C 29/76* (2013.01); *G11C 29/56008* (2013.01); *G11C 2029/5604* (2013.01)

(58) Field of Classification Search
  CPC ..... G11C 29/52; G11C 29/76; G11C 29/4401; G06F 11/1068
  See application file for complete search history.

(56) References Cited

U.S. PATENT DOCUMENTS

| | | | | |
|---|---|---|---|---|
| 2013/0329494 A1* | 12/2013 | Shirakawa | ............ | G11C 16/06 365/185.09 |
| 2014/0071756 A1* | 3/2014 | Iwai | ............ | H01L 27/1157 365/185.11 |
| 2014/0082437 A1* | 3/2014 | Wan | ............ | G11C 16/345 714/704 |
| 2014/0085982 A1* | 3/2014 | Asaoka | ............ | G11C 16/06 365/185.17 |
| 2016/0055918 A1* | 2/2016 | Kochar | ............ | G11C 16/3445 365/185.11 |

* cited by examiner

*Primary Examiner* — Sam Rizk
(74) *Attorney, Agent, or Firm* — McClure, Qualey & Rodack, LLP

(57) ABSTRACT

A memory repairing method and a memory device applying the same are disclosed, wherein the method comprises steps as follows: A memory device comprising at least one page having a plurality of cell strings is firstly provided. A regular data pattern is then provided to block at least two of the plurality of cell strings, and the blocked cells strings are marked as inaccessible.

16 Claims, 14 Drawing Sheets

MEMORY REPAIRING METHOD AND MEMORY DEVICE APPLYING THE SAME

BACKGROUND

Technical Field

The disclosure in generally relates to a memory management method and a memory device applying the same, and more particularly to a memory repairing method and a memory device applying the same.

Description of the Related Art

During the process for fabricating a memory device, defects may occur and the defect memory devices may be discarded by a quality control process. However, the defect memory devices can be repaired and recycled by memory repairing methods. Several memory repairing methods, such as redundancy repair, block repair, memory downgrade and error checking & correcting (ECC) are extensively applied in the memory device fabrication process.

However, these methods still have drawbacks. For example, a memory chip size may be undesirably enlarged, and the benefit provided by the redundant repair which may be offset due to too many redundant memories are prepared to repair defect cells. A memory block including small amount defect cells may be marked as a defect block when block repair or memory downgrade is applied, and the most no defective cells in the defect block can be discarded.

ECC is very powerful for correcting data save in a memory device, but ECC has its limitation, when the amount of data error is more than a predetermined number, the data error may not be corrected. Besides ECC is very costly in memory capacity and time consumption, which may not suitable for use in a modern memory device requiring fast access.

Therefore, there is a need of providing an improved memory repairing method and a memory device applying the same to obviate the drawbacks encountered from the prior art.

SUMMARY

One aspect of the present invention is to provide a memory repairing method, wherein the method comprises steps as follows: A memory device comprising at least one page having a plurality of cell strings is firstly provided. A regular data pattern is then provided to block at least two of the plurality of cell strings, and the blocked cells strings are marked as inaccessible.

According to another aspect of the present invention, a memory device is provided. The memory device comprises at least one page and a regular data pattern, wherein the page has a plurality of cell strings and the regular data pattern blocks at least two of the plurality of cell strings and marks the blocked cells strings as inaccessible.

In accordance with the aforementioned embodiments of the present invention, a memory repairing method and a memory device applying the same are provided. In some embodiments of the present invention, a plurality of cell strings included in a page of a memory device are divided into a plurality of subsets, wherein each of the subsets has identical number of the cell strings. A regular data pattern is then provided to block at least one of the cell strings involved in each of the subsets in a regular manner. The memory cells included in the unblocked subsets can be repaired by a subsequent memory repairing process, such as an ECC process or a redundant repair, so as to obtain a repaired memory device with smaller size and bandwidth that is still available for use.

Since most of the defect memory cells can be blocked by the regular data pattern prior to the memory repairing process, thus the memory capacity and time consumption of the memory repairing process subsequent performed on the unblocked subsets of the cells strings can be significantly reduced, and the prior art problems can be solved.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION

Figure 1A:
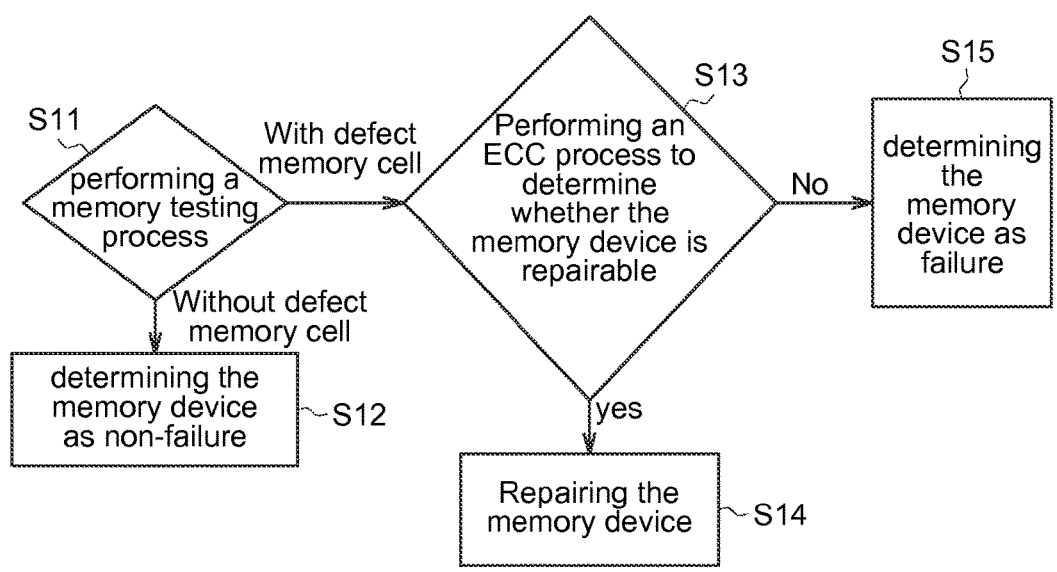
FIG. 1A is a block diagram illustrating a memory repairing method of prior art.

The embodiments as illustrated below provide a memory repairing method and a memory device applying the same to eliminating the majority of defect cells by tuning a page size of a memory device in a manner of scarifying minor cell strings on which defect cells most likely occur. The present invention will now be described more specifically with reference to the following embodiments illustrating the structure and method for fabricating the memory device.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

Figure 1B:
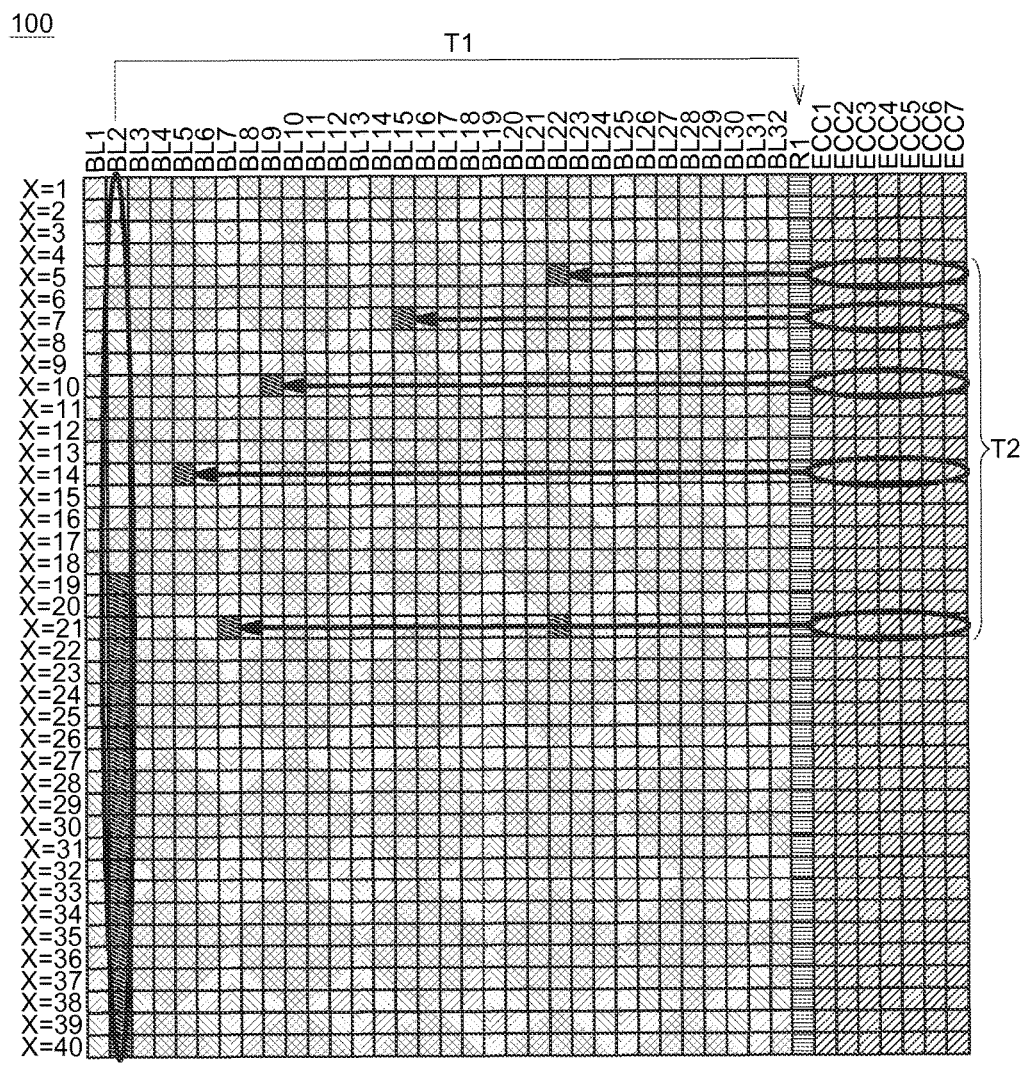
FIG. 1B illustrates a partial schematic diagram of a memory array applied by a conventional memory device.

FIG. 1A is a block diagram illustrating a memory repairing method of prior art. FIG. 1B illustrates a partial schematic diagram of a memory array 100 applied by a conventional memory device. The conventional memory repairing method starts by performing a memory testing process to figure out is there ant the defect memory cell involved in the memory device 100? (see step S11). If there is no defect memory cell is found, the memory device 100 will be determined as non-failure (see step S12). If there exists some defect memory cells, an ECC process may be performed to determine whether the memory device 100 is repairable by the ECC process (see step S13). If the memory device 100 is repairable, the ECC repairing process is performed to repair the defect memory cells of the memory device 100 (see step S14). If the memory cells of the memory device 100 are too much to be repaired, the memory device 100 will be determined as failure (see step S15).

The memory device 100 comprises a plurality of levels. Merely a top view of a certain level of the memory device 100 is illustrated in FIG. 1A, for purpose of clear description. Each level of the memory device 100 comprises a plurality bit lines $BL_a$ (wherein, a is an integer of 1~32, a=1~32), a plurality of word lines $X_b$ (wherein, b is an integer of 1~40, b=1~40) and a plurality of memory cells $(BL_a, X_b)$ formed in the intersections of the bit lines $BL_a$ and the word lines $X_b$. A plurality of memory cells $(BL_a, X_b)$ connected with the same word line $X_b$ can constitute a sub-page, and several sub-pages can constitute a page. Typically, a page may have 512, 2048 or 4096 memory cells (bits), and the memory device 100 can have a plurality of pages 101 formed thereon.

In the present case, each level of the memory device 100 may serve as one page, and each page comprises 32 cell strings, and each cell string has 40 memory cells $(BL_a, X_b, a=1~32$ and $b=1~40)$ series connected by one of bit line BL1~BL32, so as to constitute a 32×40 memory array as illustrated in FIG. 1B. In other words, each cell strings is correspondent to one of bit line BL1~BL32, thus each of the cell strings can be referred as to $BL_a$ the reference numbers of the corresponding bit lines BL1~BL32. In addition, the memory device 100 further comprises a redundant cell string R1 and a plurality cell strings ECC1~ECC7 for storing the ECC data.

After the memory testing process is carried out (in step S11), the memory cells (BL2,X19~X40) of the cell strings BL2, the memory cell (BL5,X14) of the cell strings BL5, the memory cell (BL7,X21) of the cell strings BL7, the memory cell (BL9,X10) of the cell strings BL9, the memory cell (BL15,X7) of the cell strings BL15, the memory cells (BL22,X5) and (BL22,X21) of the cell strings BL22 are determined as defect memory cells. The memory cells (BL2, X19~X40) of the cell strings BL2 can be replaced with the redundant cell string R1 by a redundant repair process (referred as to arrow T1) and the other defect memory cells may be repaired by an ECC process (referred as to arrow T2). However, in accordance with the nature of the ECC process, each set of the data that is stored in the memory cells of the cell strings ECC1~ECC7 connected with the same word line $X_b$ can be provided to repairer the merely one corresponding defect memory cell that is connected with the same word line $X_b$. Each of the defect memory cells (BL5,X14), (BL7,X21), (BL9,X10) (BL15,X7) and (BL22, X5) respectively disposed on the cell strings BL5, BL7, BL9, BL15 and BL22 can be corrected by the ECC process using the data set stored in the memory cells of the cell strings ECC1~ECC7 that are connected with the word lines X14, X10, X7 respectively. However, the two defect memory cells (BL7,X21) and (BL22,X21) respectively occurring on the cell strings BL9 and BL 11 are connected the same word line X21, the data set stored in the memory cells of the cell strings ECC1~ECC7 connected with the word line X21 can merely repair one of them. Since the amount of data error excesses the capacity of the ECC process, thus one of the two defect memory cells (BL9,X21) and (BL11,X21) cannot be repaired, and the memory device 100 will be determined as failure.

Figure 2A:
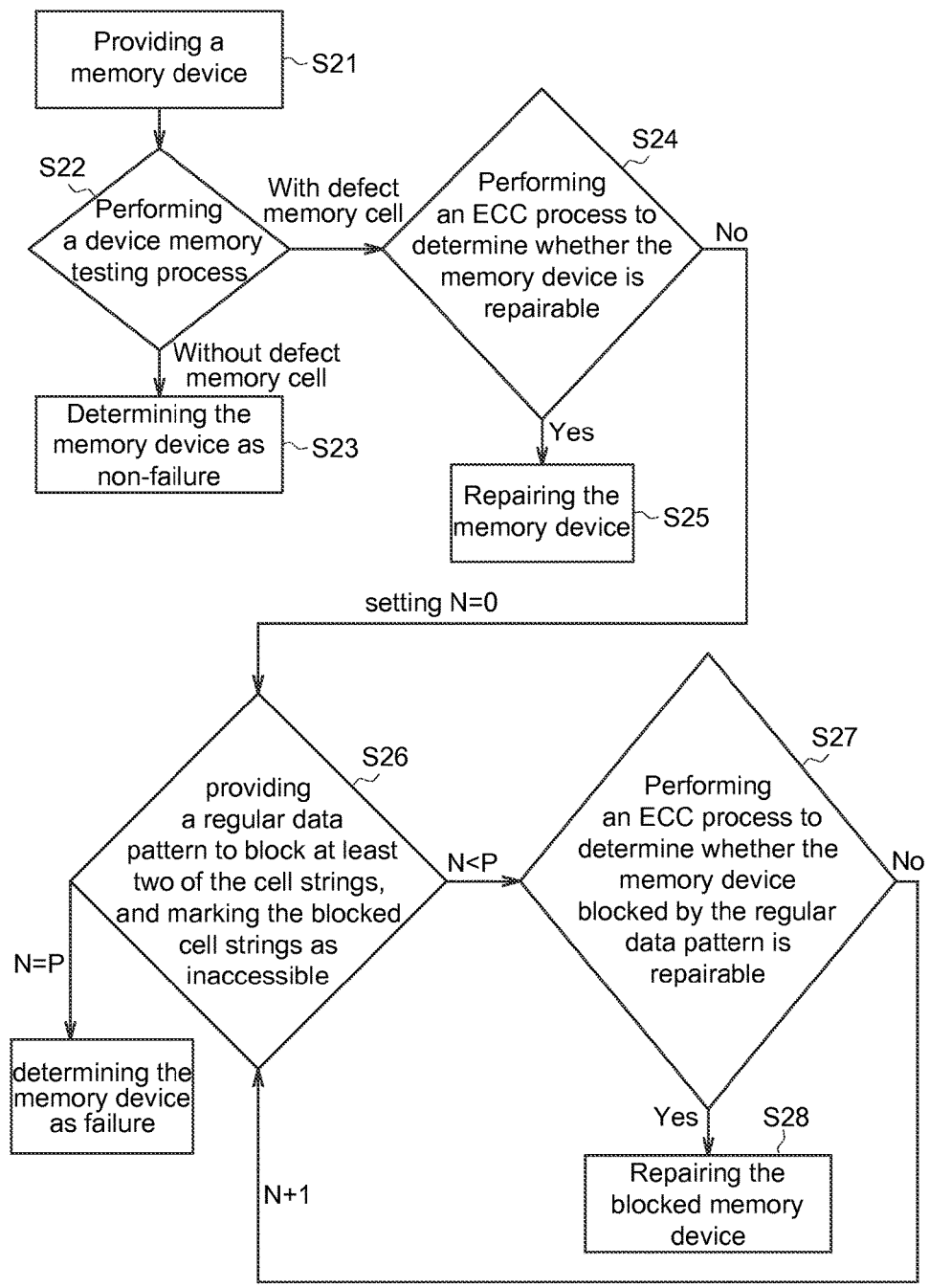
FIG. 2A is a block diagram illustrating a memory repairing method in accordance with one embodiment of the present invention.

If the majority of defect memory cells can be eliminated by tuning a page size of the memory device 100 in a manner of scarifying minor cell strings on which defect cells most likely occur, the remaining defect memory cells of the memory device 100 can be repaired by the memory repairing process, whereby a repaired memory device 100 that is still available for use can be obtained. FIG. 2A is a block diagram illustrating a memory repairing method in accordance with one embodiment of the present invention. The memory repairing method comprises several steps as follows: A memory device 200 is firstly provided (see step S21). In some embodiments of the present invention, the memory device 200 can be a non-volatile memory, such as an NAND flash memory.

Figure 2B:
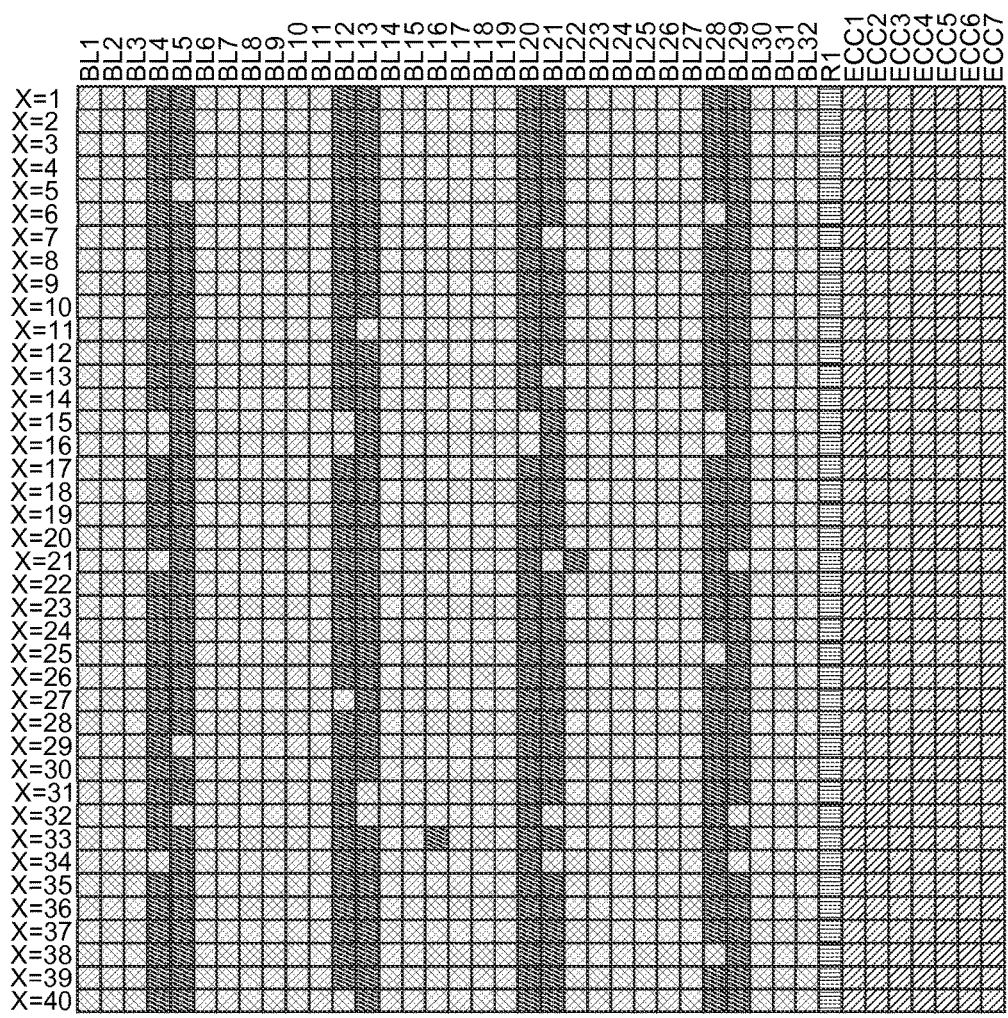
FIG. 2B illustrates a partial schematic diagram of a memory device in accordance with one embodiment of the present invention.

In the present embodiment, the memory device 200 may be (but not limited to) a 3D NAND flash memory with vertical gates. FIG. 2B illustrates a partial schematic diagram of the memory device 200 in accordance with one embodiment of the present invention. The structure of the memory device 200 is substantially similar to that of the memory device 100 except that the memory device 200 has more number of the defect memory cells. For example, most of the memory cells (BL4,X1~X40), (BL5,X1~X40), (BL12,X1~X40), (BL13,X1~X40), (BL20,X1~X40), (BL21,X1~X40), (BL28,X1~X40) and (BL29,X1~X40) on the cell strings BL4, BL5, BL12, BL13, BL20, BL21, BL28, and BL29 are defect memory cells; and the cell strings BL16 and BL22 respectively have a single defect memory cell (BL16,X33) and (BL22,X21).

However, it should be appreciated that the actual position of these defect memory cells involved in the memory device 200 are not known at the beginning of the memory repairing process, since the memory repairing method disclosed by the present invention does not start by performing the memory test process to figure out the defect memory cells involved in the memory device 200. All the defect memory cells marked at the memory array of the memory device 200 are just for the purpose for providing a clear description.

Next, a memory testing process is performed to figure out is there any defect memory cell involved in the memory device 200? (see step S22). If there is no defect memory cell is found, the memory device 200 will be determined as non-failure (see step S23). If there exists some defect memory cells, an accessing process may be performed to determine whether the memory device 200 is repairable by a memory repairing process, such as an ECC process or a redundant repair process (see step S24). If the memory device 200 is repairable, the memory repairing process is performed to repair the defect memory cells of the memory device 200 (see step S25). If the memory cells of the memory device 200 are too much to be repaired, the memory repairing method may proceed into step S26.

Figure 2C:
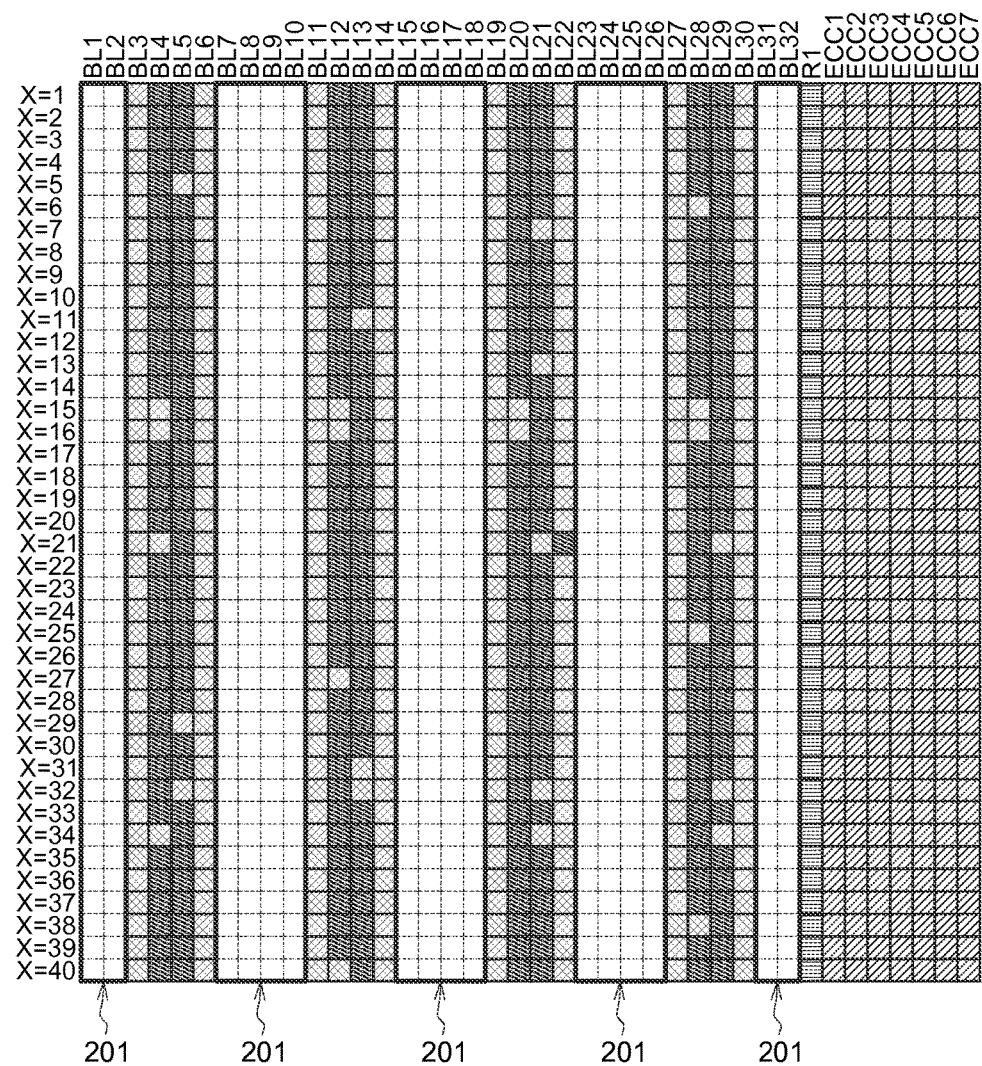
FIG. 2C illustrates a schematic diagram after the memory device depicted in FIG. 2B is blocked by a regular data pattern in accordance with one embodiment of the present invention.

In step S26, a regular data pattern 201 is provided to block at least two of the cell strings BL1~BL32 of the memory device 200, and the memory cells involved in the blocked cell strings are marked as inaccessible memory cells. FIG. 2C illustrates a schematic diagram after the memory device 200 depicted in FIG. 2B is blocked by a regular data pattern 201 in accordance with one embodiment of the present invention. In some embodiments of the present invention, the process for providing the regular data pattern 201 to block at least two of the cell strings BL1~BL32 comprises steps as follows: the cell strings BL1~BL32 of the memory device 200 are divided into a plurality of subsets each of which a number of continually arranged cell strings are allocated. One or more cell strings involved in each subset are regularly selected and blocked, whereby the blocked cell strings can constitute the regular data pattern 201, and the memory cells involved in the blocked cell strings are then marked as inaccessible memory cells. In the embodiments of the present invention, the number of the subsets (p) may be less or equal to 20; the number of the cell strings (n) involved in each subset may be greater than 2 ($n \geq 2$); and the number of the blocked cell strings (A) involve in one of the subset is less than the total number of the cell strings involved in the corresponding subset ($A<n$).

For example, in one embodiments of the present invention, two continually arranged cell strings are allocated as a subset, whereby the cell strings BL1~BL32 of the memory device 200 are divided into 16 subsets. One of the cell strings involved in each subset is regularly selected and blocked by a predetermined rule described below, and the other cell strings is remained unblocked, so as to form the regular data pattern. If the selected/blocked cell string is referred to as "0" and the unselected/unblocked cell string is referred to as "1", the selected/blocked cell strings and the unselected/unblocked cell strings can be arranged in a regular order represented by a cycle number "01" repeated for 16 times referred as a regular data pattern, wherein a half of the memory cells involved in the memory device 200 are selected/blocked and marked as inaccessible memory cells. In the present embodiment, 8 continually arranged cell strings are allocated as a subset, whereby the cell strings BL1~BL32 of the memory device 200 are divided into 4 subsets. A regular data pattern 201 having a cycle number "00111100" repeated for 4 times is provided to regularly block 4 of the 8 cell strings in each subset, and the blocked memory cells are then marked as inaccessible memory cells, wherein a half of the memory cells involved in the memory device 200 are blocked and marked as inaccessible memory cells.

Thereafter, an ECC process is performed to estimate whether the memory device 200 blocked by the regular data pattern 201 is repairable, so as to obtain a repaired memory device 200 that is still available to use (see step S27). If the blocked memory device 200 is determined as repairable, the memory repairing process is performed (see step S28); and if the blocked memory device 200 is determined as unrepairable, the process may return to step S26 for choosing another regular data pattern to block the memory device 200 and repeating the steps S27 and S28.

Of note that because the memory ECC process is rather time-consuming, thus number N of repeating steps S26, S27 and S28 may be limited in a predetermined number P, such as less of equal to 20 times ($P \leq 20$). In some embodiment of the present invention, when the step S22 is performed at the first time, the number N may be setup as 0 by a memory repairing system (not shown); the number N may be plus 1 when the step S26 is repeated every time; and a step for determining whether the number N is greater than the predetermined number P may be performed prior to the step S27 is repeated. If the number N is greater than the predetermined number P, the memory device 200 will be determined as failure and the memory repairing process is then stopped.

Referring to FIG. 2C again, since there are still large number of defect memory cells remained on the unblocked cell strings of the memory device 200 exceeding the capacity of the subsequent ECC process, thus the memory device 200 with the unblocked subsets is not repairable. Accordingly, it is necessary to repeat the step S26 in order to provide another regular data pattern, such as the regular data pattern 202, to block the cell strings of the memory device 200.

Figure 2D:
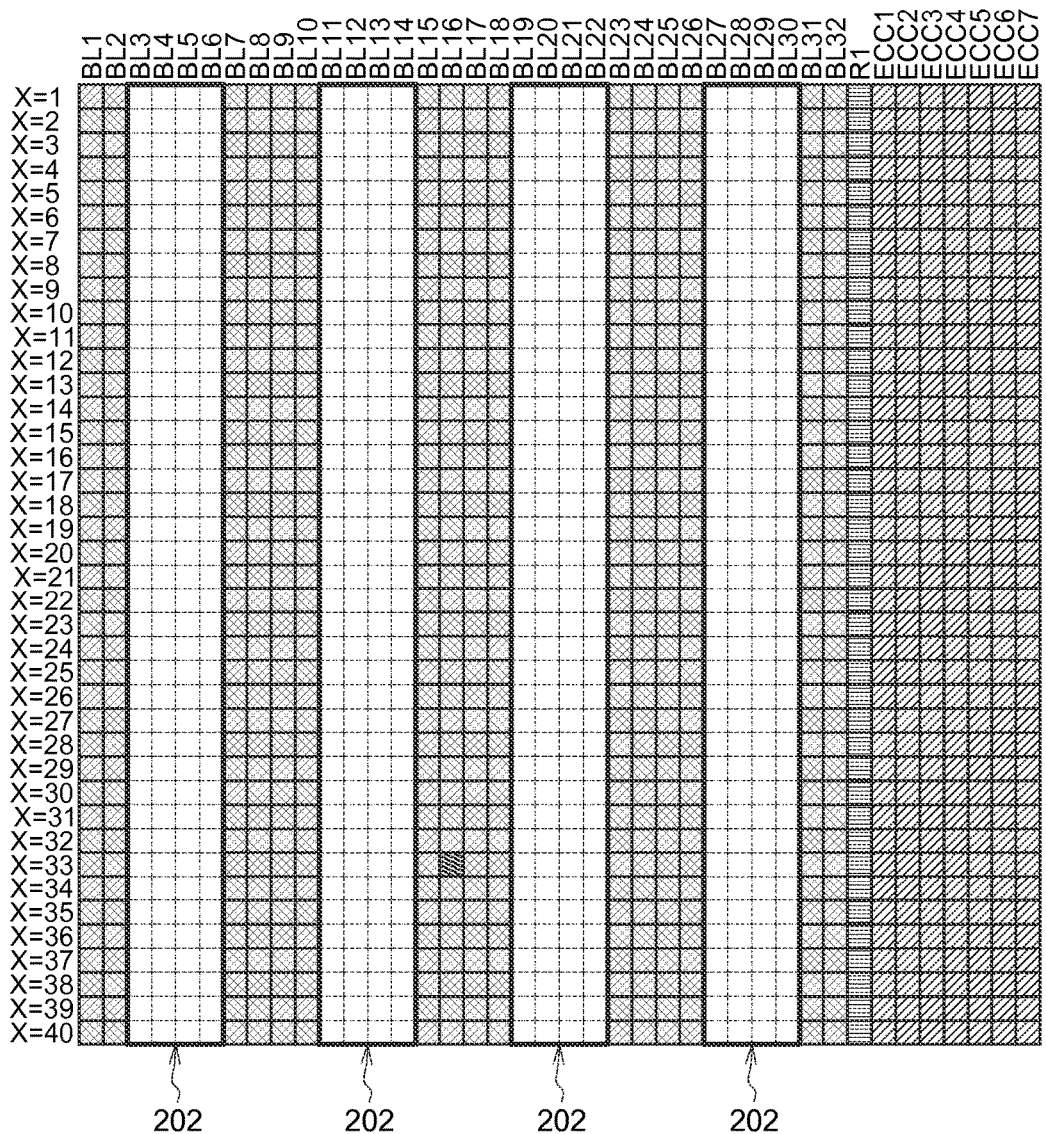
FIG. 2D illustrates a schematic diagram after the memory device depicted in FIG. 2B is blocked by another regular data pattern in accordance with one embodiment of the present invention.

FIG. 2D illustrates a schematic diagram after the memory device 200 depicted in FIG. 2B is blocked by another regular data pattern 202 in accordance with one embodiment of the present invention. In the present embodiment, 8 continually arranged cell strings are allocated as a subset, whereby the cell strings BL1~BL32 of the memory device 200 are divided into 4 subsets. The regular data pattern 202 having a cycle number "00111100" repeated for 4 times regularly blocks 4 of the 8 cell strings in each subset, and the blocked memory cells are then marked as inaccessible memory cells, wherein a half of the memory cells involved in the memory device 200 are blocked and marked as inaccessible memory cells.

As a result, most of the defect memory cells can be blocked by the regular data pattern 202 except one defect memory cell (BL16,X33) occurring at the cell string BL16 that can be repaired by a subsequent ECC process or a redundant repair. However, in comparison the original memory device 200, the page size (memory capacity) of the repaired memory device 200 is significantly reduced.

Figure 2E:
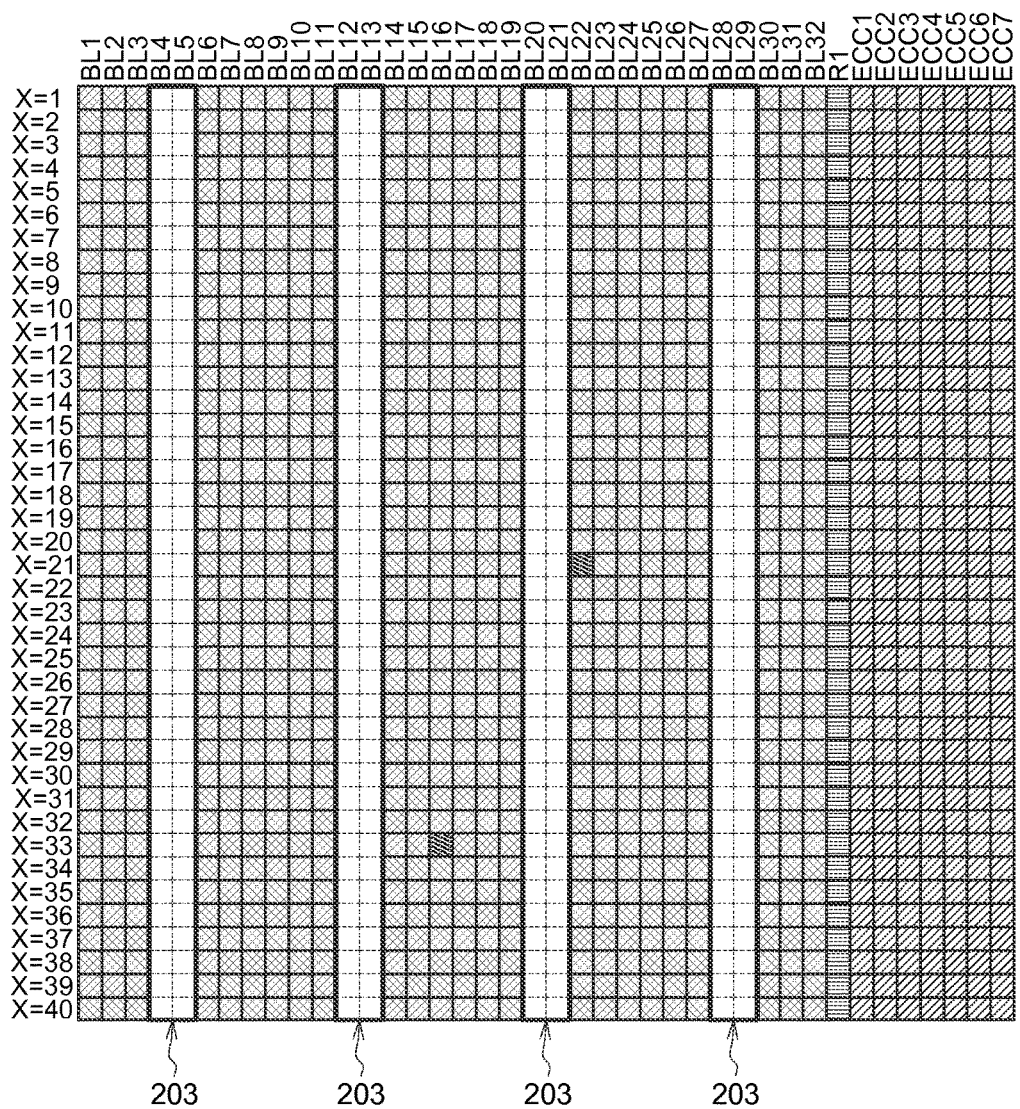
FIG. 2E illustrates a schematic diagram after the memory device depicted in FIG. 2B is blocked by yet another regular data pattern in accordance with one embodiment of the present invention.

In some other embodiment, the page size of the repaired memory device 200 may be enlarged by reducing the number of the cell strings blocked by the regular data pattern. For example, FIG. 2E illustrates a schematic diagram after the memory device 200 depicted in FIG. 2B is blocked by yet another regular data pattern 203 in accordance with one embodiment of the present invention. In the present embodiment, 8 continually arranged cell strings are allocated as a subset, whereby the cell strings BL1~BL32 of the memory device 200 are divided into 4 subsets. The regular data pattern 202 having a cycle number "11100111" repeated for 4 times regularly blocks 2 of the 8 cell strings in each subset, and the blocked memory cells are then marked as inaccessible memory cells, wherein ¼ memory cells involved in the memory device 200 are blocked and marked as inaccessible memory cells.

In the present embodiment, most of the defect memory cells also can be blocked by the regular data pattern 202 to merely remain the defect memory cells (BL16,X33) and (BL22,X21) respectively occurring at the cell strings BL16 and BL22 that can be repaired by a subsequent ECC process or a redundant repair. The page size of the repaired memory device 200 depicted in FIG. 2E is greater than that of the repaired memory device 200 depicted in FIG. 2D that is blocked by the regular data pattern 202, nevertheless is still less than that of the original memory device 200.

Figure 2F:
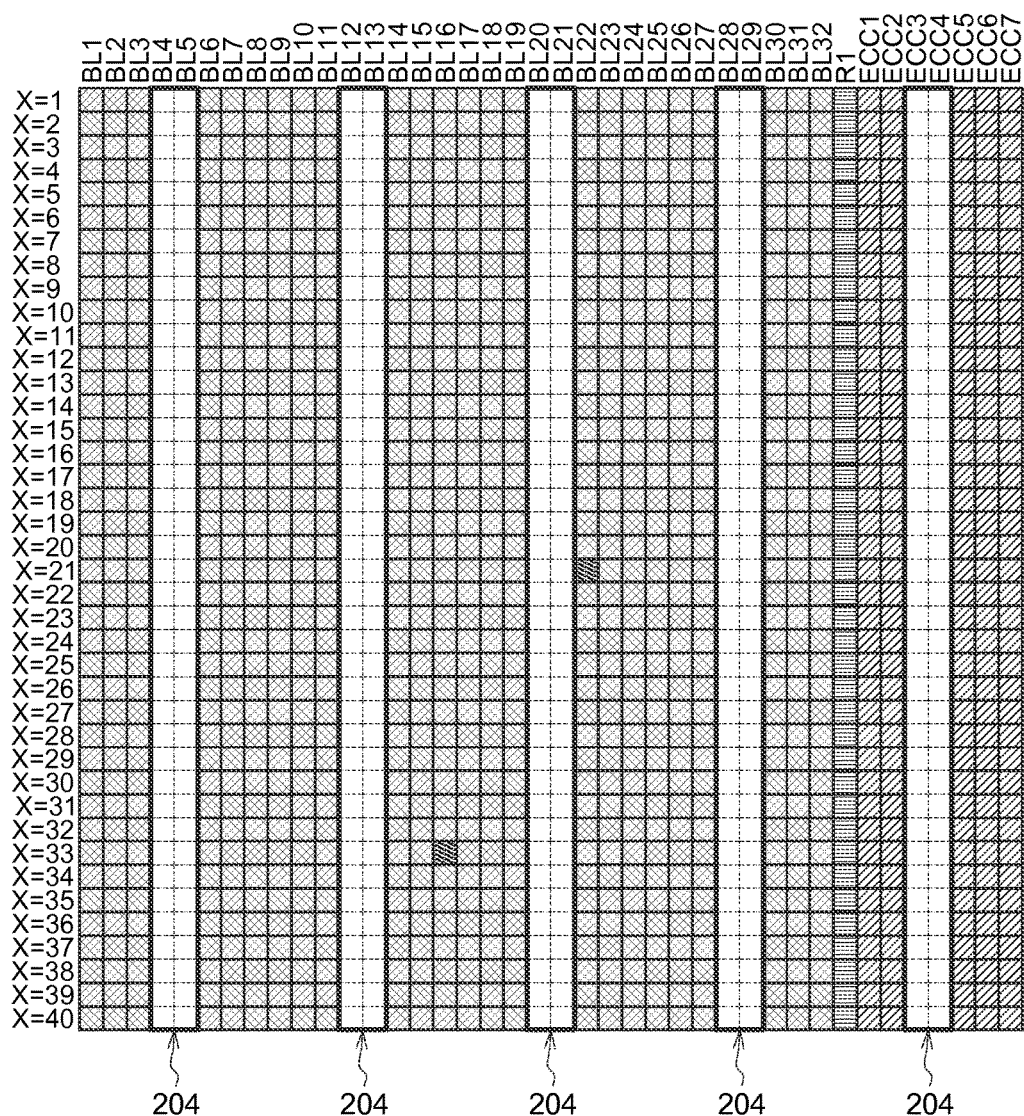
FIG. 2F illustrates a schematic diagram after the memory device depicted in FIG. 2B is blocked by yet another regular data pattern in accordance with one embodiment of the present invention.

The aforementioned memory repairing method also can be applied to repair the redundant cell string R1 and the cell strings ECC1~ECC7. For example, FIG. 2F illustrates a schematic diagram after the memory device 200 depicted in FIG. 2B is blocked by yet another regular data pattern 204 in accordance with one embodiment of the present invention. In the present embodiment, the structure of the regular data pattern 204 is substantially similar to that of the regular data pattern 203, except that the regular data pattern 204 not only blocks the cell strings involved in the memory array of the memory device 200 but also blocks portions of the cell strings ECC1~ECC7.

Figure 2G:
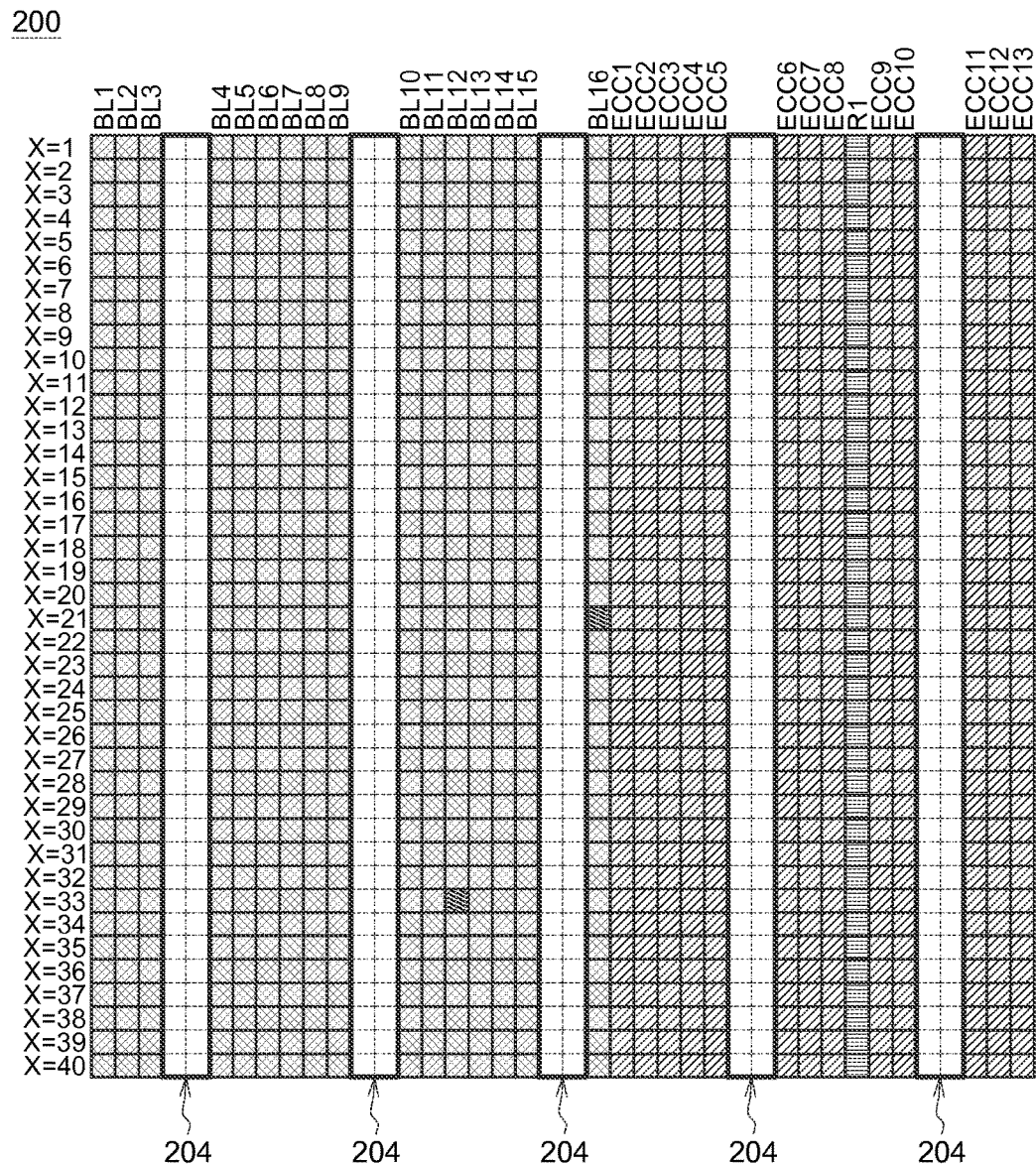
FIG. 2G illustrates the results after the cell strings of the memory device depicted in FIG. 2F is rearranged in accordance with one embodiment of the present invention.

In some embodiments of the present invention, the memory array of the repaired memory device 200 can be rearranged. For example, FIG. 2G illustrates the results after the cell strings of the memory device 200 blocked by the regular data pattern 204, as depicted in FIG. 2F, is rearranged in accordance with one embodiment of the present invention. Typically, if a memory device has a page size of $2^k$ bytes, the page size of the blocked and rearranged memory device may be reengaged to be $2^{k-1}$ bytes, wherein k is an integer. In the present embodiment, the page size of the blocked and rearranged memory device 200 is reduced from 32 cell strings BL1~BL32 to 16 cell strings. The page size of the blocked and rearranged page is reduced to about one half of the original page size.

Because, the regular data pattern merely blocks ¼ cell strings of the memory device 200, thus there remains extra cell strings ECC1~ECC13 that can be allocated to store the ECC data. The page of memory device 200 that is blocked by the regular data pattern 204 has more ECC repairable memory cells than that in the original page of memory device 200 that is not blocked by the regular data pattern 204, nevertheless the page size of the blocked and rearranged page is just about one half of the original page size. In other words, after the ECC process is carried out (see step S28), the reliability of the repaired memory device 200 can be increased significantly.

It should be appreciated that the process of repeating the step S26 to choose another regular data pattern to block the memory device 200 and repeating the steps S23 as described in FIG. 2A is not just a try-and-error process, in some embodiments of the present invention, the regular data pattern are designed and selected in accordance with a risk analysis of the process for fabricating the memory device, since the defect memory cells may regularly occur at some physical positions of memory device due to some undesired failure step during the process for fabricating the memory device.

Figure 3A:
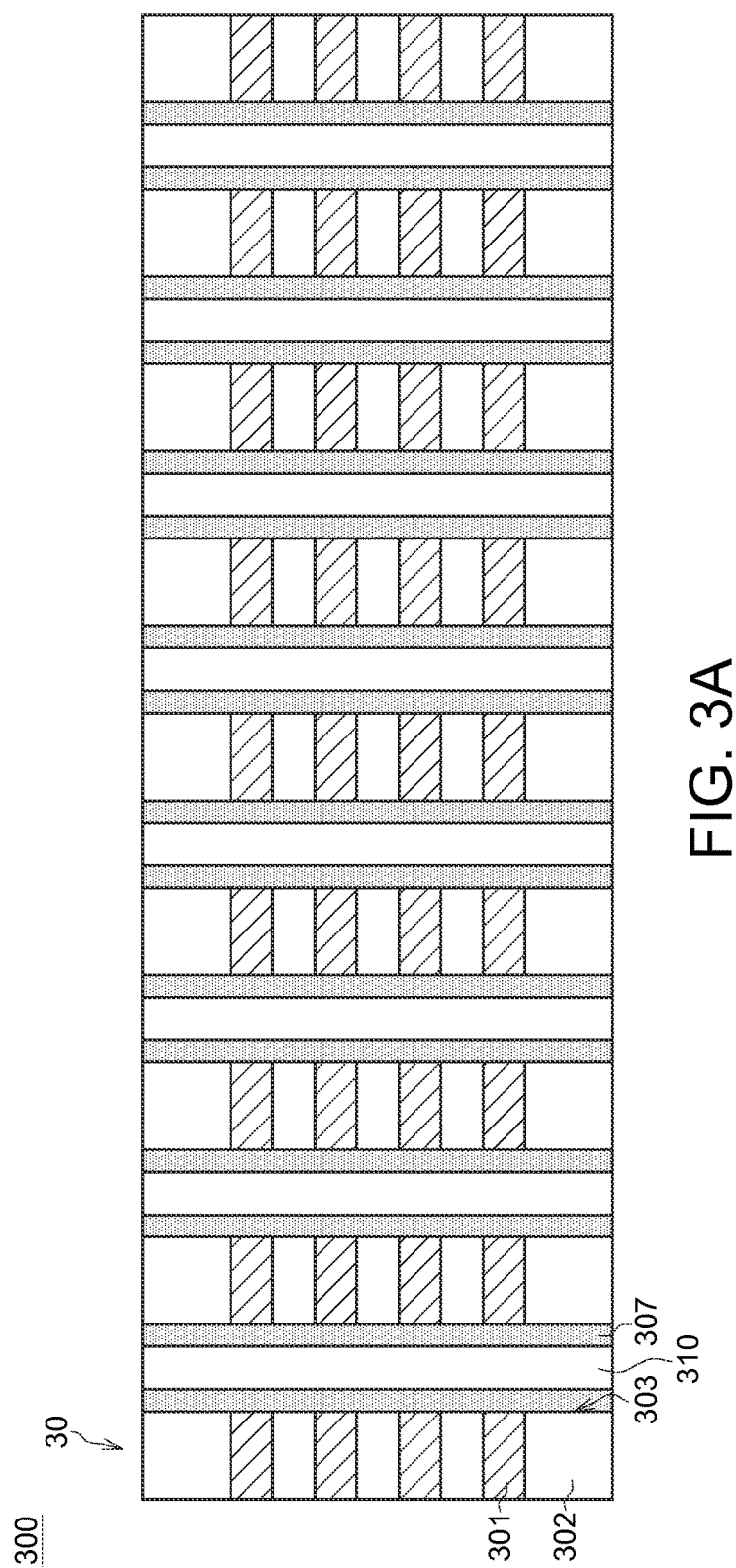
FIG. 3A to 3C are cross-sectional views illustrating a series of processing structures for fabricating a (3D) NAND memory device in accordance with one embodiment of the present invention.
Figure 3B:
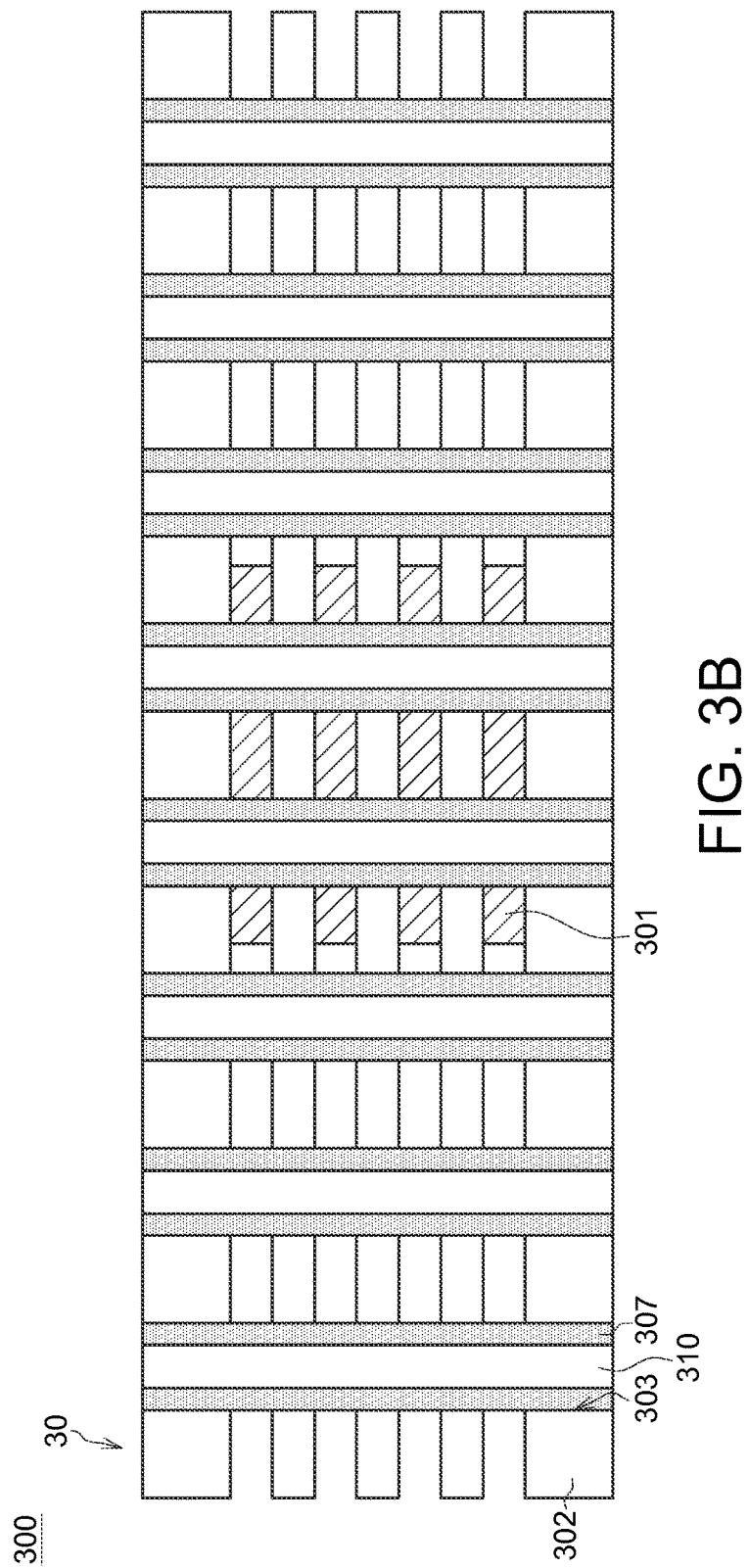
Figure 3C:
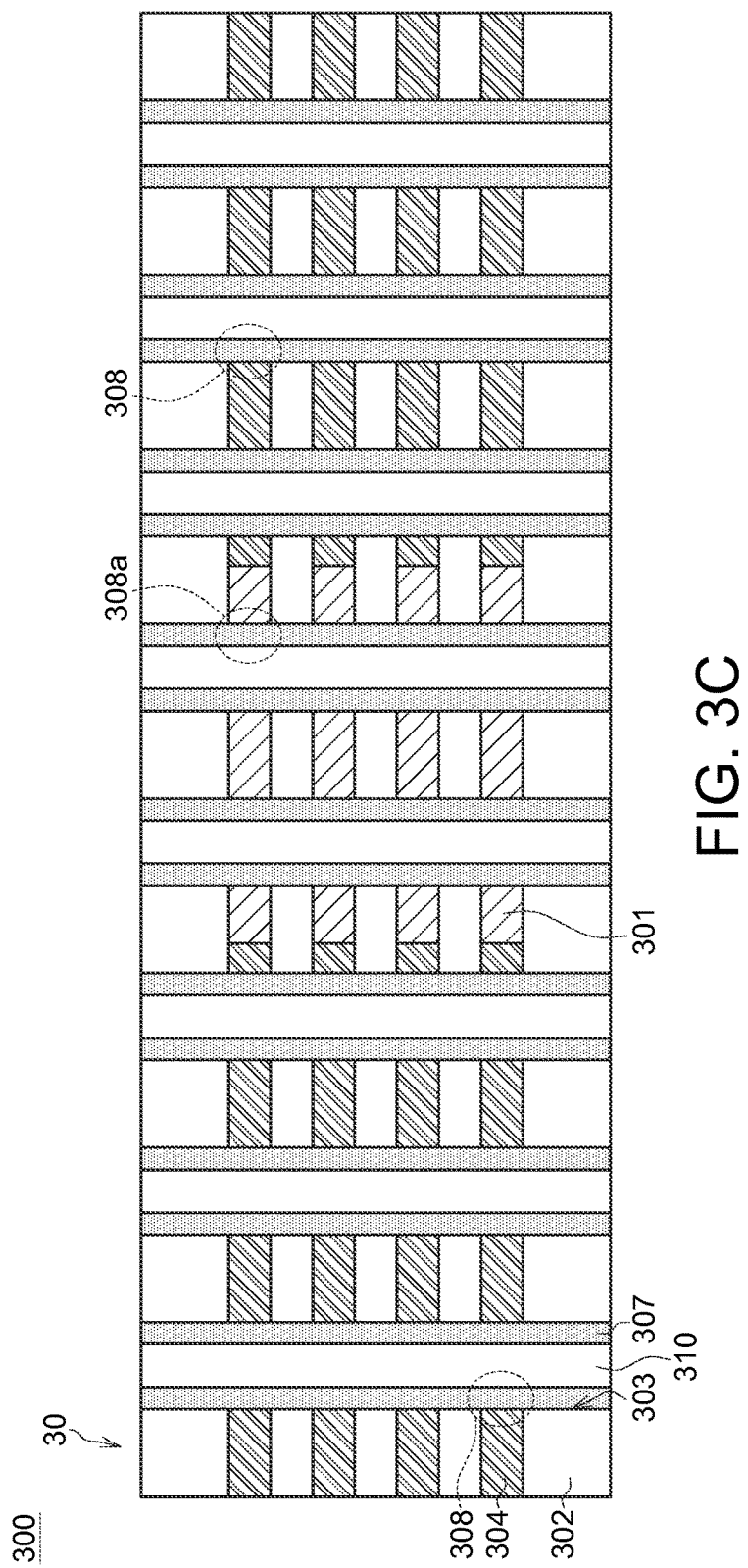

FIGS. 3A to 3C are cross-sectional views illustrating a series of processing structures for fabricating a 3D NAND memory device 300 with vertical gate in accordance with one embodiment of the present invention. In the present embodiment, the forming of the 3D NAND memory device 300 comprises steps as follows: A multi-stacked structure 30 comprising a plurality of scarifying layers 301 (preferably made of silicon nitride) and a plurality of insulating layers 302 (preferably made of silicon oxide) alternatively attacked with each other is firstly provided. A plurality of trench 303 passing through the scarifying layers 301 and the insulating layers 302 are then formed in the multi-stacked structure 30. A memory layer 307 is then formed on the sidewalls of the trench 303, and semiconductor material (such as undoped poly-silicon) subsequently fulfills the trench 303 to form a plurality of bit lines 310 in the multi-stacked structure 30 (see FIG. 3A). Thereafter, a pull-back etching process is performed to remove the scarifying layers 301 (see FIG. 3B). Subsequently, a conductive material, such as a metal, is formed to fill the space originally occupied by the scarifying layers 301, whereby a plurality of memory cells 308 are formed at the intersection of the memory layer 307, the bit lines 310 and the gate electrode 304 (see FIG. 3C).

Since the scarifying layers 301 are embedded in the multi-stacked structure 300, thus residues may occur at the central part of the multi-stacked structure 300 due to the remaining scarifying layers 301 after the pull-back etching process is carried out (see FIG. 3B). As a result, the memory cells 308 formed on the bit lines 310 (cell strings) that are located at the central part of the multi-stacked structure 30 may be more likely defeat. The majority of the defect memory cells 308 (marked by circles) can be eliminated by selecting a proper regular data pattern 311 to block the cell strings that are associated with the bit line 310 and marking the blocked memory cells 308 formed on the selected bit lines 310 to be inaccessible in accordance with the aforementioned process analysis. The remaining memory cells 308 that are not blocked by the regular data pattern can be repaired by a subsequent ECC process, a redundant repair or the combination thereof, so as to make the repaired 3D NAND memory device 300 still available for use.

Figure 3D:
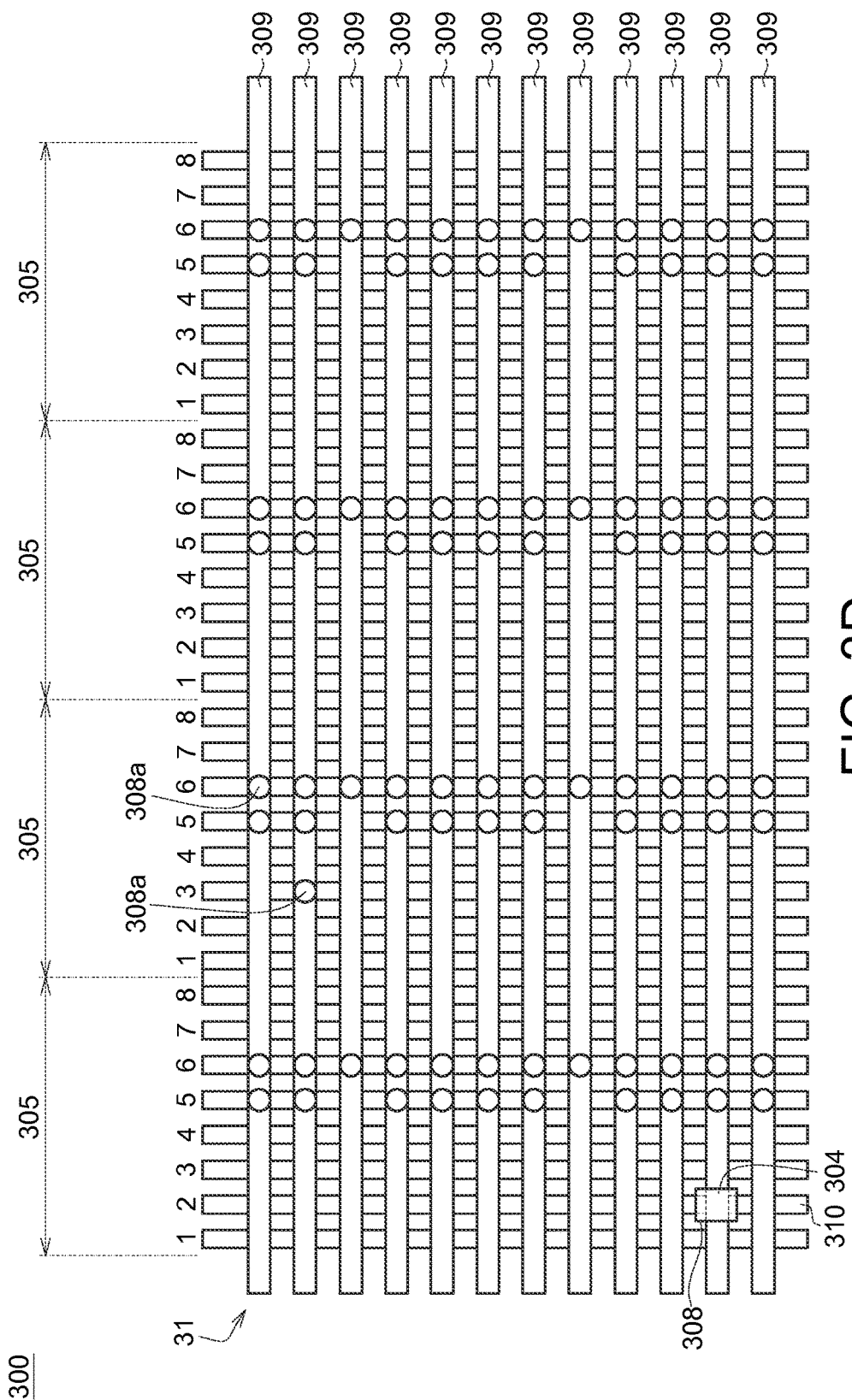
FIG. 3D illustrates a partial page diagram of the 3D NAND memory device with vertical gates depicted in FIG. 3C.

The process for sleeting the proper regular data pattern 311 comprises steps as follows: Firstly, a series of numerical words are assigned to these bit lines 310 involved in each page of the 3D NAND memory device 300, so as to form numbers of repeat cycle 305 that has a set numbers repeating several times. For purpose for providing a clear description please refer to FIG. 3D, FIG. 3D illustrates a partial page diagram of the 3D NAND memory device 300 depicted in FIG. 3C. In the present embodiment, the number assigning of the 32 bit lines 310 depicted in FIG. 3D comprises steps as follows:

These 32 bit lines 310 are divided into 8 subsets each of which has equal number of the bit lines 310 that are continually arranged, and each bit line 310 in each subset is then assigned with a numeral word, wherein the numeral words assigned in the same group are ranked in series, and different subset are assigned with the same set of numeral words. As a result, the numeral words assigned to these bit lines can form numbers of repeat cycle 305 repeating a set of numeral words for 4 times. For example, 8 bit lines 310 laid out from right to left in sequence are allocated as a subset, the bit lines 103 contained in the same group is then assigned one of the numeral words of 1, 2, 3, 4, 5, 6, 7 and 8 in accordance with their location laid out from right to left in sequence. As a result, the numeral words assigned to the 32 bit lines 103 can form numbers of repeat cycle 305 repeating the set of numeral words 1, 2, 3, 4, 5, 6, 7 and 8 for 4 times.

Figure 3E:
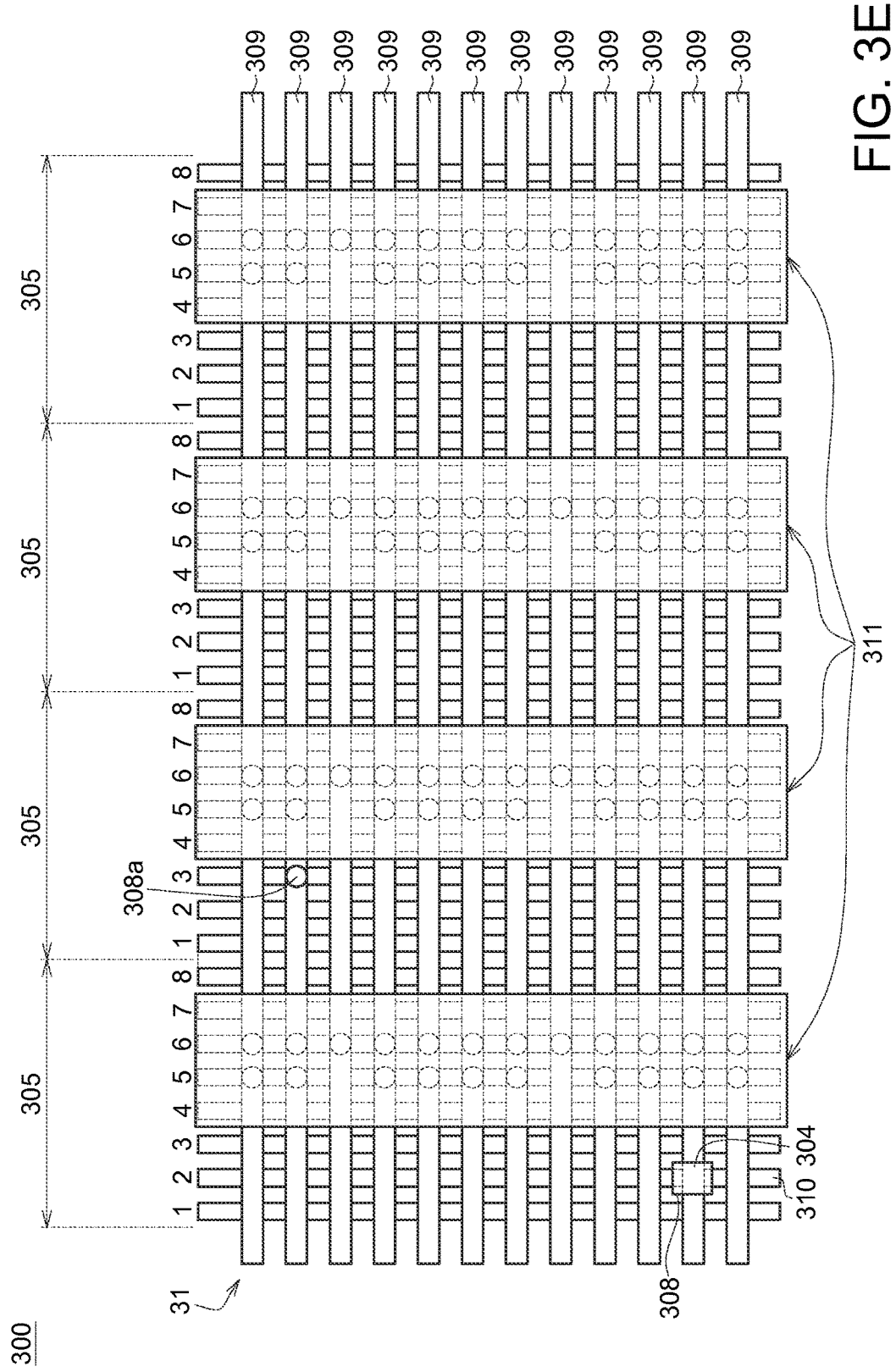
FIG. 3E illustrates the results after the page diagram of the 3D NAND memory device depicted in FIG. 3D is blocked by a regular data pattern.

Subsequently, at least one cluster of the bit lines 310 that are assigned with the same numerical word is then blocked to form the regular data pattern 311, and the memory cells series connected by the blocked bit lines 310 are then marked as inaccessible memory cells 308a. FIG. 3E illustrates the results after the page diagram of the 3D NAND memory device 300 depicted in FIG. 3D is blocked by the regular data pattern 311. In the present embodiment, the bit lines 103 that are assigned with the numeral words 4, 5, 6 and 7 in the numbers of repeat cycle 305 are blocked to form the regular data pattern 311. In other words, if the blocked bit lines 310 are referred to as "0" and the unblocked bit lines 310 are referred to as "1", the regular data pattern 311 can be represented by a cycle number"00011110" repeated for 4 times, wherein a half of the memory cells involved in the 3D NAND memory device 300 are blocked and marked as inaccessible memory cells.

By using the regular data pattern 311 to blocked the 3D NAND memory device 300, the blocked bit lines 310 containing most defect memory cells 308a can be precluded from being repaired, and the unblocked bit lines 310 may contain few defect memory cells 308a that is not exceeding the capacity of the subsequent memory repairing process, such that a repaired 3D NAND memory device 300 with smaller size and bandwidth that is still available for use can be obtain by the subsequent memory repairing process.

In accordance with the aforementioned embodiments of the present invention, a memory repairing method and a memory device applying the same are provided. In some embodiments of the present invention, a plurality of cell strings included in a page of a memory device are divided into a plurality of subsets, wherein each of the subsets has identical number of the cell strings. A regular data pattern is then provided to block at least one of the cell strings involved in each of the subsets in a regular manner. The memory cells included in the unblocked subsets can be repaired by a subsequent memory repairing process, such as an ECC process or a redundant repair, so as to obtain a repaired memory device with smaller size and bandwidth that is still available for use.

Since most of the defect memory cells can be blocked by the regular data pattern prior to the memory repairing process, thus the memory capacity and time consumption of the memory repairing process subsequent performed on the unblocked subsets of the cells strings can be significantly reduced, and the prior art problems can be solved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory repairing method, comprising:
   providing a memory device comprising at least one page having a plurality of cell strings;
   performing a memory testing process to figure out is there a defect memory cell involved in the memory device;
   performing an accessing process to determine whether the memory device is repairable by a memory repairing process;
   when the memory device is determined as unrepairable, dividing the plurality of cell strings into a plurality of subsets, wherein each of the subsets has at least two identical number of the cell strings; and
   selecting at least one of the cell strings from each of the subsets in accordance with a predetermined location sequence of the cell strings in each of the subsets, whereby the selected cell strings can be arranged in a regular order; and
   marking the selected cell strings as inaccessible.

2. The method according to claim 1, when the memory device is determined as repairable by the accessing process, further comprising performing a memory repairing step including an error checking & correcting (ECC) process, an redundant repair or the combination thereof on the cell strings that are not marked as inaccessible.

3. The method according to claim 2, wherein a plurality of ECC reparable memory cells involved in the cell strings that are not marked as inaccessible are more than that involved in the cell strings that are marked as inaccessible of the page.

4. The method according to claim 1, wherein when the selected cell strings are referred to as "0" and the unselected cell strings are referred to as "1", the selected cell strings and the unselected cell strings can be arranged in the regular order represented by a cycle number "01", "00111100", "11000011", "11100111" or "00011110" repeated for a plurality of times.

5. The method according to claim 1, wherein the plurality of cell strings are divided into less or equal to 20 subsets; each of the subsets has more than 2 of the cell strings; and not all of the cell strings involved in each one of the subsets are selected and marked as inaccessible.

6. The method according to claim 1, wherein the memory device has a page size of $2^k$ bytes, and the repaired memory device has a page size of $2^{k-1}$ bytes.

7. The method according to claim 1, wherein
   the process of dividing the plurality of cell strings into a plurality of subsets comprises: assigning a series of numerical words to the plurality of cell strings, so as to form numbers of repeat cycle repeating the numeral words for a plurality times; and
   the process of selecting at least one of the cell strings comprises: selecting at least one cluster of the cell strings assigned with the same numerical word as one of the subsets.

8. The method according to claim 7, wherein the process of assigning a series of numerical words to the plurality of cell strings comprises steps of making the plurality of cell strings associated with physical locations or fabricating processes of the memory device.

9. The method according to claim 8, wherein the process of making the plurality of cell strings associated with physical locations or fabricating processes of the memory device comprises steps of making each of the cell strings associated with a bit line of the memory device.

10. A memory device, comprising:
    a plurality of bit lines; and
    at least one page, having a plurality of cell strings divided into a plurality of subsets each has at least two identical number of the cell strings;
    wherein at least one of the cell strings involved in each of the subsets is selected and marked as inaccessible in accordance with a predetermined location sequence of the cell strings in each of the subsets to make the selected cell strings arranged in a regular order.

11. The memory device according to claim 10, wherein when the selected cell strings are referred to as "0" and the unselected cell strings are referred to as "1", the selected cell strings and the unselected cell strings can be arranged in the regular order represented by a cycle number "01", "00111100", "11000011", "11100111" or "00011110" repeated for a plurality of times.

12. The memory device according to claim 11, wherein the plurality of cell strings are divided into less or equal to 20 subsets; each of the subsets has more than 2 of the cell strings; and not all of the cell strings involve in one of the subsets are selected and marked as inaccessible.

13. The memory device according to claim 10, wherein the plurality of cell strings involved in each of the subsets are assigned a series of numerical words, so as to form numbers of repeat cycle repeating the numeral words for a plurality times; and at least one cluster of the cell strings assigned with the same numerical word are marked as inaccessible.

14. The memory device according to claim 10, wherein each of the cell strings is corresponding to a bit line of the memory device.

15. The memory device according to claim 10, further comprising a redundant cell stings, cell strings for storing ECC data or the combination thereof.

16. The memory device according to claim 10, wherein a plurality of ECC reparable memory cells involved in the cell strings that are not marked as inaccessible are more than that involved in the cell strings that are marked as inaccessible of the page.

* * * * *